US010145902B2

(12) United States Patent
Hanada et al.

(10) Patent No.: US 10,145,902 B2
(45) Date of Patent: Dec. 4, 2018

(54) STORAGE BATTERY CAPACITY MEASUREMENT DEVICE

(71) Applicant: TOSHIBA MITSUBISHI-ELECTRIC INDUSTRIAL SYSTEMS CORPORATION, Chuo-ku (JP)

(72) Inventors: Masato Hanada, Tokyo (JP); Daisuke Tsurumaru, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 15/519,882

(22) PCT Filed: Oct. 21, 2014

(86) PCT No.: PCT/JP2014/077976
§ 371 (c)(1),
(2) Date: Apr. 18, 2017

(87) PCT Pub. No.: WO2016/063354
PCT Pub. Date: Apr. 28, 2016

(65) Prior Publication Data
US 2017/0315182 A1   Nov. 2, 2017

(51) Int. Cl.
*H02J 7/04*     (2006.01)
*H02J 7/16*     (2006.01)
(Continued)

(52) U.S. Cl.
CPC ..... *G01R 31/3679* (2013.01); *G01R 31/3658* (2013.01); *H01M 10/4285* (2013.01);
(Continued)

(58) Field of Classification Search
CPC .................................................. G01R 31/3679
(Continued)

(56) References Cited

FOREIGN PATENT DOCUMENTS

JP     2012-43623 A     3/2012
JP     2014-110692   *  6/2014   ............. H02J 7/35
                                               320/149

(Continued)

OTHER PUBLICATIONS

International Search Report dated Nov. 25, 2014, in PCT/JP2014/077976, filed Oct. 21, 2014.
(Continued)

*Primary Examiner* — Edward Tso
*Assistant Examiner* — Ahmed Omar
(74) *Attorney, Agent, or Firm* — Oblon, McClelland, Maier & Neustadt, L.L.P.

(57) ABSTRACT

A storage battery capacity measurement device is provided in in-plant equipment including a storage battery system connected to an intra-equipment electric wire. The storage battery system includes plural storage batteries connected in parallel to the intra-equipment electric wire. The storage battery capacity measurement device is configured to execute a determining one storage battery among the plural storage batteries as a measurement target storage battery, and at least one storage battery other than the measurement target storage battery as a measurement support storage battery, discharging an electricity amount of the measurement target storage battery from an upper limit to a lower limit, and charging the discharged electricity amount to the measurement support storage battery, and calculating a discharge capacity of the measurement target storage battery, based on an integrated value of a current flowing through the measurement target storage battery during discharge.

2 Claims, 6 Drawing Sheets

(51) Int. Cl.
*H02J 7/00* (2006.01)
*G01R 31/36* (2006.01)
*H01M 10/42* (2006.01)
*H01M 10/48* (2006.01)
*H02J 3/32* (2006.01)
*H02J 7/35* (2006.01)

(52) U.S. Cl.
CPC ............ *H01M 10/482* (2013.01); *H02J 3/32* (2013.01); *H02J 7/0054* (2013.01); *H02J 7/35* (2013.01)

(58) Field of Classification Search
USPC ................................................ 320/134, 103
See application file for complete search history.

(56) References Cited

FOREIGN PATENT DOCUMENTS

| | | | | |
|---|---|---|---|---|
| JP | 2014-110692 A | 6/2014 | | |
| JP | 2014-117003 A | 6/2014 | | |
| JP | 2014-124063 A | 7/2014 | | |
| JP | 2014-154437 | * | 8/2014 | ............ H01M 10/44 320/149 |
| JP | 2014-154437 A | 8/2014 | | |

OTHER PUBLICATIONS

International Preliminary Report on Patentability and Written Opinion dated May 4, 2017 in PCT/JP2014/077976.
Japanese Office Action dated Jun. 12, 2018 in Patent Application No. 2016-554983 (with unedited computer generated English translation), 6 pages.

* cited by examiner

STORAGE BATTERY CAPACITY MEASUREMENT DEVICE

FIELD

The present invention relates to a storage battery capacity measurement device provided in equipment including a storage battery system.

BACKGROUND

A power system is constructed by connecting power generation equipment and load equipment by a power transmission facility. There are power systems in various scales from a large-scale system connecting a plurality of large-scale power plants and many factories, commercial facilities and households to a small-scale system constructed within a specific facility.

In-plant equipment provided in a plant such as a power plant or a factory includes, for example, a load system, a power generation system, and a storage battery system. The in-plant equipment is connected to a power system. The power system or the in-plant equipment includes an energy management system (EMS) that manages at least in-plant electric power supply/demand, and the electric power supply/demand of the individual systems and the power system is balanced by the energy management system.

One type of power generation system utilizes natural energy such as sunlight and wind power. The power generation system utilizing the natural energy is being widely introduced in response to rise in awareness of energy problems or environmental problems in recent years. However, the power generation system utilizing the natural energy has a disadvantage that power cannot be stably supplied since generated power tends to be controlled by natural factors such as seasons and weather. In order to make up for the disadvantage, the equipment for which the power generation system and the storage battery system are combined is being considered.

The storage battery system is used as a means for stabilizing power supplied to a load system by the power generation system and the power system, or power supplied to the power system and the load system by the power generation system. It was thought before that it is difficult to store a large amount of power, however, since a storage battery of a large capacity such as a lithium-ion battery and sodium-sulfur battery is put into practical use, it is made possible to store the large amount of power. By connecting the storage battery system including such a storage battery to the power generation system, an operation is possible in which excess power is charged in the storage battery when supply is excessive in contrast with power demand, and power insufficiency is compensated by discharge from the storage battery when the supply is insufficient in contrast with the power demand. By combining the storage battery system with the power generation system utilizing the natural energy, the generated power that fluctuates depending on seasons and weather or the like is leveled by charge/discharge of the storage battery, and the power can be stably supplied to the power system.

Note that the applicant recognizes literatures described below as the ones associated with the present invention. JP 2014-117003 A discloses a configuration that a photovoltaic power generation system and a storage battery system are connected and fluctuation of generated power of photovoltaic power generation is suppressed by charge/discharge control of a storage battery. JP 2014-124063 A discloses one example of the storage battery system including a plurality of power conditioning systems (PCSes) connected to the power system. JP 2012-43623 A discloses a configuration of calculating a charge rate of the storage battery from an integrated value of a current flowing to the storage battery.

CITATION LIST

Patent Literature

[PTL 1] JP 2014-117003 A
[PTL 2] JP 2014-124063 A
[PTL 3] JP 2012-43623 A

SUMMARY

Technical Problem

In the above-described power generation equipment for which the power generation system and the storage battery system are combined, for control to stably supply power to the power system, it is needed to highly accurately measure a state (a discharge capacity, a charge rate, or the like) of the storage battery. Now, the discharge capacity of the storage battery declines as charge and discharge are repeated. Therefore, it is needed to periodically measure the latest discharge capacity. Note that the discharge capacity is an amount of electricity discharged by the storage battery in the case that the discharge is performed from a full charge state to a discharge end voltage. In addition, also in the case that there are restrictions regarding a power flow, a reverse power flow and power or the like between the power system and the power generation equipment (for example, the limitation of the power to be supplied to the power system, the limitation to inhibit power purchase from the power system, or the like), it is needed to be able to periodically measure the latest discharge capacity without affecting the power system.

The present invention is implemented in order to solve the above-described problem, and an object is to provide a storage battery capacity measurement device capable of measuring a discharge capacity of a storage battery without affecting a power system.

Solution to Problem

In order to achieve the above-described object, in-plant equipment provided with a storage battery capacity measurement device relating to an embodiment of the present invention is configured as follows.

The storage battery capacity measurement device relating to the embodiment of the present invention is provided in the in-plant equipment including a storage battery system connected to an intra-equipment electric wire. The in-plant equipment is, for example, equipment arranged inside a plant such as a power plant or a factory. The in-plant equipment may include a power generation system and a load system connected to the storage battery system through the intra-equipment electric wire. The intra-equipment electric wire is connected to a power system.

The storage battery system includes a plurality of storage batteries connected in parallel to the intra-equipment electric wire. The storage battery may be configured by a single storage battery cell or may be configured as an assembly of a plurality of storage battery cells. As a kind of the storage battery, the storage battery of a large capacity such as a lithium-ion battery, a sodium-sulfur battery or a nickel-hydrogen battery is preferable.

The storage battery capacity measurement device relating to the embodiment of the present invention is configured to execute a determination step, a measurement target discharge step, and a discharge capacity calculation step.

In the determination step, the storage battery capacity measurement device determines one storage battery among the plurality of storage batteries as a measurement target storage battery. In addition, the storage battery capacity measurement device determines at least one storage battery other than the measurement target storage battery among the plurality of storage batteries as a measurement support storage battery. Here, the measurement support storage battery and the measurement target storage battery are determined such that the discharge capacity on specifications of the measurement support storage battery is larger than the discharge capacity on specifications of the measurement target storage battery.

The measurement target discharge step is executed after the determination step is executed. In the measurement target discharge step, the storage battery capacity measurement device discharges an electricity amount of the measurement target storage battery from an upper limit to a lower limit, and charges the discharged electricity amount to the measurement support storage battery. Note that the upper limit electricity amount is the electricity amount in a state that charge is completed, and corresponds to the electricity amount of a so-called full charge state. Whether or not the upper limit is reached can be determined on the basis of a charge time or a decrease state of charge current, for example. In addition, the lower limit electricity amount corresponds to the electricity amount of a so-called empty state. Whether or not the lower limit is reached can be determined by detecting decline of a voltage to a discharge end voltage. Note that the measurement target storage battery is charged to the upper limit electricity amount by power reception from the power system or the power generation system or power reception from the measurement support storage battery.

The discharge capacity calculation step is executed in parallel with the measurement target discharge step. In the discharge capacity calculation step, the storage battery capacity measurement device calculates the discharge capacity (ampere-hour (Ah)) of the measurement target storage battery on the basis of an integrated value of a current flowing through the measurement target storage battery during the discharge by the measurement target discharge step.

In a preferable form of the storage battery capacity measurement device relating to the embodiment of the present invention, the storage battery capacity measurement device is configured to execute a measurement target charge step further. The measurement target charge step is executed after the determination step is executed and before the measurement target discharge step is executed. In the measurement target charge step, the storage battery capacity measurement device charges the electricity amount of the measurement target storage battery to the upper limit by discharging the measurement support storage battery.

Advantageous Effects of Invention

According to the storage battery capacity measurement device relating to the embodiment of the present invention, the discharge capacity of the storage battery can be measured without affecting the power system.

DESCRIPTION OF EMBODIMENTS

Hereinafter, embodiments of the present invention will be described in details with reference to the drawings. Note that same signs are attached to elements in common in the respective diagrams and redundant descriptions are omitted.
Embodiment 1
[System Configuration of Embodiment 1]

Figure 1:
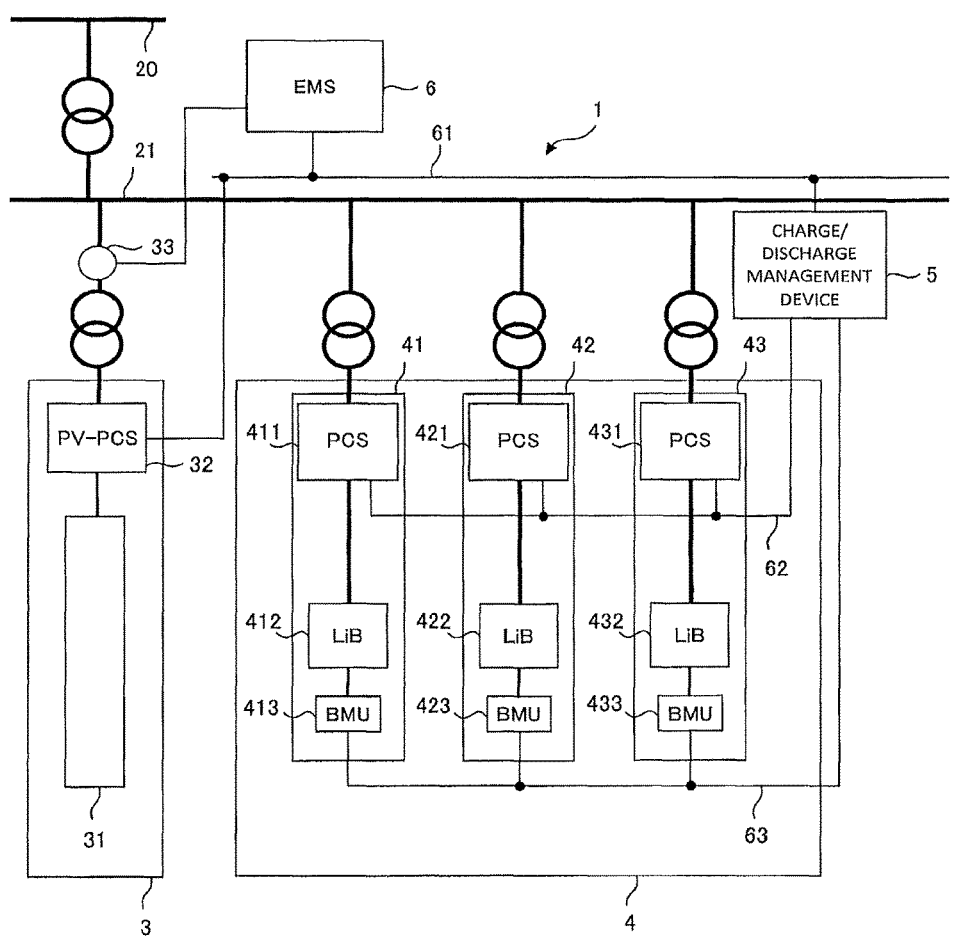
FIG. 1 is a conceptual configuration diagram for describing a system configuration relating to an embodiment 1 of the present invention.

FIG. 1 is a conceptual configuration diagram for describing a system configuration relating to the embodiment 1 of the present invention. In-plant equipment 1 illustrated in FIG. 1 is connected to a power transmission facility 20 of a power system. In the power system, other than the power transmission facility 20, power generation equipment (omitted in the figure) and load equipment (omitted in the figure) may be connected to the power transmission facility 20.

The intra-plant equipment 1 illustrated in FIG. 1 includes a power generation system 3 and a storage battery system 4. The power generation system 3, the storage battery system 4 and the power system are connected through an intra-equipment electric wire 21.

Further, the intra-plant equipment 1 includes a charge/discharge management device 5 and an energy management system (hereinafter, EMS) 6. The power generation system 3, the storage battery system 4, the charge/discharge management device 5 and the EMS 6 are connected through a computer network 61.
(Power Generation System)

The power generation system 3 illustrated in FIG. 1 is a photovoltaic power generation (PV) system. Note that the power generation system 3 may be a wind power generation system, a hydraulic power generation system, a tidal power generation system, a geothermal power generation system, or the like. The power generation system 3 includes a photovoltaic power generation module 31, and a power conditioning system for photovoltaic power generation (hereinafter, PV-PCS) 32. In the power generation system 3, the PV-PCS 32 is connected to at least one photovoltaic power generation module 31. The PV-PCS 32 is connected to the intra-equipment electric wire 21 through a power meter 33. In FIG. 1, the power meter 33 is arranged between the power generation system 3 and the intra-equipment electric wire 21, but it is just one example. The power meter 33 may be incorporated in the power generation system 3. The power meter 33 is connected to the EMS 6 by a signal line.

The power meter 33 detects generated power supplied from the power generation system 3 to the intra-equipment electric wire 21 regularly. However, regular detection in the present embodiment is a concept including not only an operation of fetching continuous signals without an interval from a sensor but also an operation of fetching signals of the sensor in a predetermined short cycle. A generated power value detected in the power meter 33 is inputted to the EMS 6.

(Storage Battery System)

The storage battery system 4 includes a plurality of power conditioning systems (hereinafter, PCSes) for the storage battery. Hereinafter, in order to facilitate descriptions, a group configured by one PCS, the storage battery connected to the PCS and a battery management unit (hereinafter, BMU) is referred to as a "PCS group".

A first PCS group 41 includes a first PCS 411, a first storage battery 412, and a first BMU 413. A second PCS group 42 includes a second PCS 421, a second storage battery 422, and a second BMU 423. A third PCS group 43 includes a third PCS 431, a third storage battery 432, and a third BMU 433. Since basic configurations of the individual PCS groups are similar, here, the first PCS group 41 is exemplified and described. Note that, in FIG. 1, three PCS groups are plotted, however, there may be just the plurality of PCS groups.

Regarding the first PCS group 41, the first PCS 411 is connected to the first storage battery 412. The first storage battery 412 is connected to the first BMU 413. The first BMU 413 is connected to the charge/discharge management device 5 by a computer network 63.

The first PCS 411 is connected to the intra-equipment electric wire 21 by a power transmission line through a transformer. The first PCS 411 has a charge function of converting AC power outputted by the power generation system 3, the second PCS group 42, and the third PCS group 43 to the intra-equipment electric wire 21 to DC power and charging the DC power to the first storage battery 412. In addition, the first PCS 411 has a discharge function of converting the DC power of the first storage battery 412 to the AC power and discharging the AC power to the intra-equipment electric wire 21. A charge amount to the first storage battery 412 and a discharge amount from the first storage battery 412 are adjusted by the first PCS 411. The first storage battery 412 is charged and discharged by the first PCS 411 according to charge/discharge commands supplied from the charge/discharge management device 5.

The first storage battery 412 includes a module for which a plurality of cells are connected in series. The plurality of modules may be connected in parallel. Each cell is a lithium-ion battery (LiB).

The first BMU 413 monitors a state of the first storage battery 412. Specifically, the BMU 413 includes a current sensor, a voltage sensor, and a temperature sensor as means for measuring a state amount of the first storage battery 412. A current flowing to the first storage battery 412 is measured by the current sensor. A voltage of each cell is measured by the voltage sensor. And, a temperature of the first storage battery 412 is measured by the temperature sensor. The first storage battery 412 is regularly monitored by the first BMU 413. However, regular monitoring in the present embodiment is the concept including not only the operation of fetching the continuous signals without an interval from the sensor but also the operation of fetching the signals of the sensor in a predetermined short cycle. The first BMU 413 transmits storage battery information including information obtained by measurements by the respective sensors to the charge/discharge management device 5.

The first PCS 411, the first storage battery 412 and the first BMU 413 of the first PCS group 41 are described above, and the above-described basic configuration is similar also for the second PCS group 42 and the third PCS group 43.

(Energy Management System (EMS))

The EMS 6 includes a memory including a ROM and a RAM or the like for example, an input/output interface that inputs and outputs various kinds of information, and a processor capable of executing various kinds of arithmetic processing on the basis of the various kinds of information. The EMS 6 is connected to the charge/discharge management device 5 through the computer network 61. The EMS 6 manages at least in-plant electric power supply/demand. For example, the EMS 6 determines a charge/discharge request to the storage battery system 4 so as to balance the electric power supply/demand of the power system, the power generation system 3 and the storage battery system 4. The charge/discharge request is transmitted to the charge/discharge management device 5. Now, in the system configuration illustrated in FIG. 1, the intra-plant equipment 1 includes the power generation system 3, however, the configuration of the intra-plant equipment 1 is not limited thereto. A load system may be provided instead of the power generation system 3, or the load system connected to the intra-equipment electric wire 21 may be provided together with the power generation system 3. In such a configuration, the EMS 6 determines the charge/discharge request to the storage battery system 4 so as to balance the electric power supply/demand of the power system, the power generation system 3, the storage battery system 4 and the load system.

(Charge/Discharge Management Device)

The charge/discharge management device 5 includes a memory including a ROM and a RAM or the like for example, an input/output interface that inputs and outputs various kinds of information, and a processor capable of executing various kinds of arithmetic processing on the basis of the various kinds of information. The charge/discharge management device 5 is connected to the EMS 6 and the PV-PCS 32 by the computer network 61. The charge/discharge management device 5 is connected to the first PCS 411, the second PCS 421, and the third PCS 431 by a computer network 62. The charge/discharge management device 5 is connected to the first BMU 413, the second BMU 423, and the third BMU 433 by the computer network 63. Note that, in FIG. 1, the charge/discharge management device 5 is arranged outside the storage battery system 4, however, it may be arranged inside the storage battery system 4 or the EMS 6.

The charge/discharge management device 5 is configured to be able to execute individual steps to be described later, and plays a role of a controller that issues the charge/discharge command to the first PCS 411, the second PCS 421 and the third PCS 431 on the basis of the charge/discharge request received from the EMS 6. In addition, the charge/discharge management device 5 has a PV-PCS output suppression function of suppressing output of the power generation system 3 in the case of receiving an output suppression command from a host system or in the case that the storage battery is in a full charge state.

[Characteristic Configuration of Embodiment 1]

Figure 2:
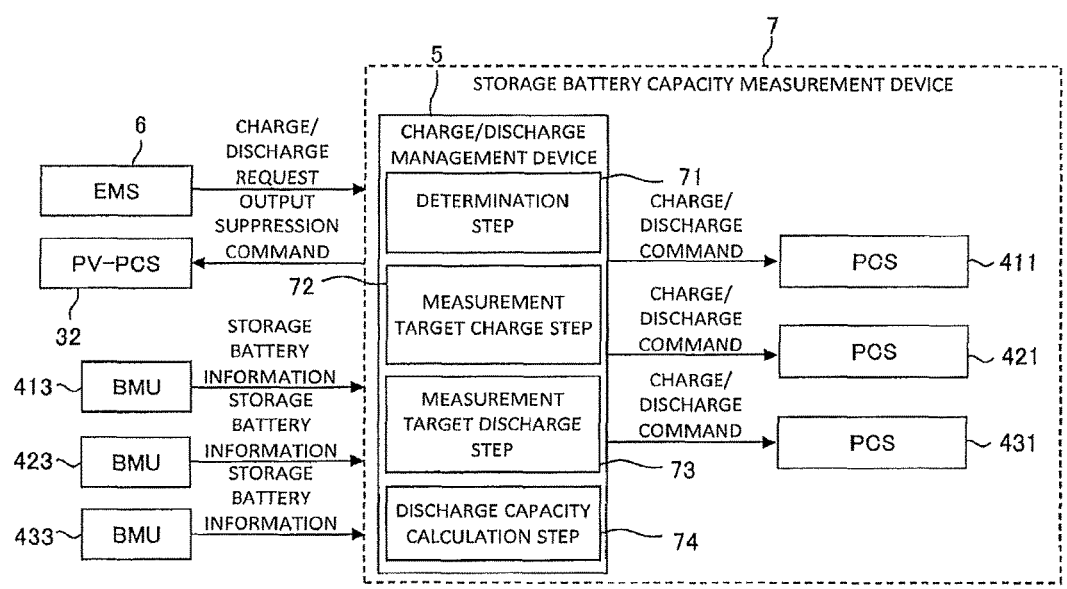
FIG. 2 is a block diagram of a system relating to the embodiment 1 of the present invention.

FIG. 2 is a block diagram of a system relating to the embodiment 1 of the present invention.

A storage battery capacity measurement device 7 relating to the present invention illustrated in FIG. 2 includes the charge/discharge management device 5, the first PCS 411, the second PCS 421, and the third PCS 431.

Inside a block indicating the charge/discharge management device 5, a part of various processing that the charge/discharge management device 5 has is expressed by a block. An arithmetic resource is allocated to each of the blocks. Programs corresponding to the respective blocks are prepared in the charge/discharge management device 5, and by executing them by the processor, the processing of each block is realized in the charge/discharge management device 5.

(Determination Step)

The charge/discharge management device 5 is configured to execute the processing of a determination step 71. In the determination step, the charge/discharge management device 5 determines one storage battery among the plurality of storage batteries as a measurement target storage battery. In addition, the charge/discharge management device 5 determines at least one storage battery other than the measurement target storage battery among the plurality of storage batteries as a measurement support storage battery. Here, the measurement support storage battery and the measurement target storage battery are determined such that a discharge capacity on specifications of the measurement support storage battery is larger than a discharge capacity on specifications of the measurement target storage battery.

For example, in the case that the discharge capacities on the specifications of the first storage battery 412, the second storage battery 422 and the third storage battery 432 are the same, the charge/discharge management device 5 determines the first storage battery 412 of the first PCS group 41 as the measurement target storage battery, and determines the second storage battery 422 of the second PCS group 42 and the third storage battery 432 of the third PCS group 43 as the measurement support storage batteries. It is similar in an example described below.

Note that the charge/discharge management device 5 determines a different storage battery as the measurement target storage battery every time the processing of the determination step 71 is executed.

(Measurement Target Charge Step)

The charge/discharge management device 5 is configured to execute the processing of a measurement target charge step 72. The measurement target charge step 72 is executed after the determination step 71 is executed. In the measurement target charge step 72, the charge/discharge management device 5 charges an electricity amount of the measurement target storage battery to an upper limit by discharging the measurement support storage battery.

For example, the charge/discharge management device 5 transmits a discharge command to the second PCS 421 and the third PCS 431 so as to discharge the second storage battery 422 and the third storage battery 432 until the electricity amount of the first storage battery 412 reaches the upper limit. In addition, the charge/discharge management device 5 transmits a charge command to the first PCS 411 so as to charge the electricity amount discharged by the second storage battery 422 and the third storage battery 432 to the first storage battery 412.

Here, the upper limit electricity amount is the electricity amount in a state that the charge is completed, and corresponds to the electricity amount of a so-called full charge state. Whether or not the upper limit is reached can be determined on the basis of a charge time or a decrease state of charge current, for example. Note that, in the case that the first storage battery 412 is already in the full charge state, the measurement target charge step 72 may not be executed.

(Measurement Target Discharge Step)

The charge/discharge management device 5 is configured to execute the processing of a measurement target discharge step 73. The measurement target discharge step 73 is executed after the measurement target charge step 72 is executed. However, in the case that the electricity amount of the measurement target storage battery has already reached the upper limit, since further charge is not necessary, the measurement target discharge step 73 is executed after the determination step 71 is executed. In the measurement target discharge step 73, the charge/discharge management device 5 discharges the electricity amount of the measurement target storage battery from the upper limit to a lower limit, and charges the discharged electricity amount to the measurement support storage battery.

For example, the charge/discharge management device 5 transmits the discharge command to the first PCS 411 so as to discharge the first storage battery 412 until the electricity amount of the first storage battery 412 reaches the lower limit. In addition, the charge/discharge management device 5 transmits the charge command to the second PCS 421 and the third PCS 431 so as to proportionately divide the electricity amount discharged by the first storage battery 412 and charge it to the second storage battery 422 and the third storage battery 432.

Here, the lower limit electricity amount corresponds to the electricity amount of a so-called empty state. Whether or not the lower limit is reached can be determined by detecting decline of the voltage to a discharge end voltage.

(Discharge Capacity Calculation Step)

The charge/discharge management device 5 is configured to execute the processing of a discharge capacity calculation step 74. The discharge capacity calculation step 74 is executed in parallel with the measurement target discharge step 73. In the discharge capacity calculation step 74, the charge/discharge management device 5 calculates the discharge capacity of the measurement target storage battery on the basis of an integrated value of a current flowing through the measurement target storage battery during the discharge by the measurement target discharge step 73.

(Flowchart)

Figure 3:
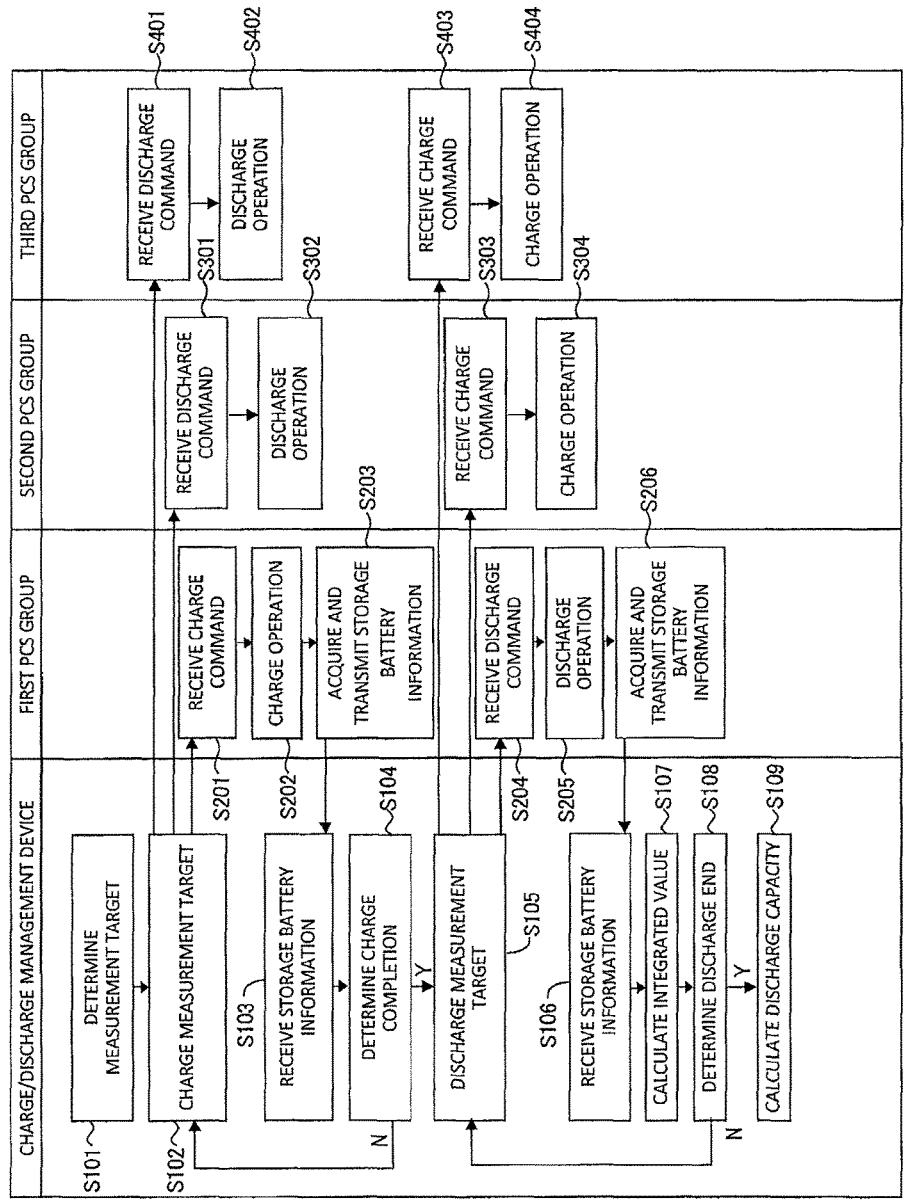
FIG. 3 is a flowchart of a control routine executed by a storage battery capacity measurement device 7, in the system relating to the embodiment 1 of the present invention.

FIG. 3 is a flowchart of a control routine executed by the storage battery capacity measurement device 7, in the system relating to the embodiment 1 of the present invention. The processing of the charge/discharge management device 5 illustrated in the flowchart is realized by executing each processing of the determination step 71, the measurement target charge step 72, the measurement target discharge step 73 and the discharge capacity calculation step 74. The program that executes the processing in the flowchart illustrated in FIG. 3 is stored in the memory of the charge/discharge management device 5, and by reading and executing the program by the processor of the charge/discharge management device 5, the processing illustrated in FIG. 3 is realized.

First, the charge/discharge management device 5 determines the measurement target storage battery and the measurement support storage batteries (step S101). Processing content of step S101 is as described in the description of the determination step 71. In the description of FIG. 3, the charge/discharge management device 5 determines the first storage battery 412 of the first PCS group 41 as the measurement target storage battery, and the second storage battery 422 of the second PCS group 42 and the third storage battery 432 of the third PCS group 43 as the measurement support storage batteries.

Next, the charge/discharge management device 5 transmits the charge/discharge command in order to charge the electricity amount of the measurement target storage battery to the upper limit by discharging the measurement support storage batteries (step S102). The processing content of step S102 is as described in the description of the measurement target charge step 72. In an example illustrated in FIG. 3, the charge/discharge management device 5 transmits the discharge command to the second PCS group 42 and the third PCS group 43. Simultaneously, the charge/discharge management device 5 transmits the charge command to the first PCS group 41.

In the second PCS group 42, the second PCS 421 receives the discharge command transmitted from the charge/discharge management device 5 (step S301). The second PCS 421 executes a discharge operation to the second storage battery 422 according to the discharge command (step S302).

In the third PCS group 43, the third PCS 431 receives the discharge command transmitted from the charge/discharge management device 5 (step S401). The third PCS 431 executes the discharge operation to the third storage battery 432 according to the discharge command (step S402).

In the first PCS group 41, the first PCS 411 receives the charge command transmitted from the charge/discharge management device 5 (step S201). The first PCS 411 executes a charge operation to the first storage battery 412 according to the charge command (step S202).

Further, in the first PCS group 41, the first BMU 413 acquires the storage battery information using the various kinds of sensors. The storage battery information includes the current flowing through the first storage battery 412, the voltage of the first storage battery 412, and the temperature of the first storage battery 412. Thereafter, the first BMU 413 transmits the acquired storage battery information to the charge/discharge management device 5 (step S203).

The charge/discharge management device 5 receives the storage battery information transmitted from the first BMU 413 (step S103).

Next, the charge/discharge management device 5 determines whether or not the charge is completed on the basis of each storage battery information received in step S103 (step S104). For example, in the case that the charge time set beforehand elapses or in the case that the charge current becomes lower than a setting value set beforehand, it is determined that the charge of the first storage battery 412 is completed. In the case that a determination condition is not established, the processing is continued again from step S102.

In the case that the determination condition in step S104 is established, next, the charge/discharge management device 5 transmits the charge/discharge command so as to discharge the electricity amount of the measurement target storage battery from the upper limit to the lower limit and to charge the discharged electricity amount to the measurement support storage batteries (step S105). The processing content of step S105 is as described in the description of the measurement target discharge step 73. In the example illustrated in FIG. 3, the charge/discharge management device 5 transmits the discharge command to the first PCS group 41, and also transmits the charge command to the second PCS group 42 and the third PCS group 43.

In the second PCS group 42, the second PCS 421 receives the charge command transmitted from the charge/discharge management device 5 (step S303). The second PCS 421 executes the charge operation to the second storage battery 422 according to the charge command (step S304).

In the third PCS group 43, the third PCS 431 receives the charge command transmitted from the charge/discharge management device 5 (step S403). The third PCS 431 executes the charge operation to the third storage battery 432 according to the charge command (step S404).

In the first PCS group 41, the first PCS 411 receives the discharge command transmitted from the charge/discharge management device 5 (step S204). The first PCS 411 executes the discharge operation to the first storage battery 412 according to the discharge command (step S205).

Further, in the first PCS group 41, the first BMU 413 acquires the storage battery information using the various kinds of sensors. Thereafter, the first BMU 413 transmits the acquired storage battery information to the charge/discharge management device 5 (step S206).

The charge/discharge management device 5 receives the storage battery information transmitted from the first BMU 413 (step S106).

Next, the charge/discharge management device 5 calculates the integrated value of the current flowing through the first storage battery 412, on the basis of the storage battery information (step S107)

Next, the charge/discharge management device 5 determines whether or not the discharge is ended, on the basis of the storage battery information received in step S103 (step S108). For example, in the case that the voltage declines to the discharge end voltage set beforehand, it is determined that the discharge of the first storage battery 412 is ended. In the case that the determination condition is not established, the processing is executed again from step S105.

In the case that the determination condition in step S108 is established, the charge/discharge management device 5 calculates the discharge capacity (Ah) based on the integrated value of the current calculated in step S107 (step S109).

As described above, according to the storage battery capacity measurement device 7 of the present embodiment, by performing the charge/discharge such that the measurement target storage battery and the measurement support storage battery cancel power use of each other, influence on the power system can be suppressed. Therefore, according to the storage battery capacity measurement device 7 of the present embodiment, the discharge capacity of the storage battery can be measured even under a system restriction condition.

Embodiment 2

[System Configuration of Embodiment 2]

Next, the embodiment 2 of the present invention will be described with reference to FIG. 4 to FIG. 6. The system of the present embodiment can be realized by making the storage battery capacity measurement device 7 execute the routine in FIG. 6 to be described later, in the configuration illustrated in FIG. 4 and FIG. 5.

Figure 4:
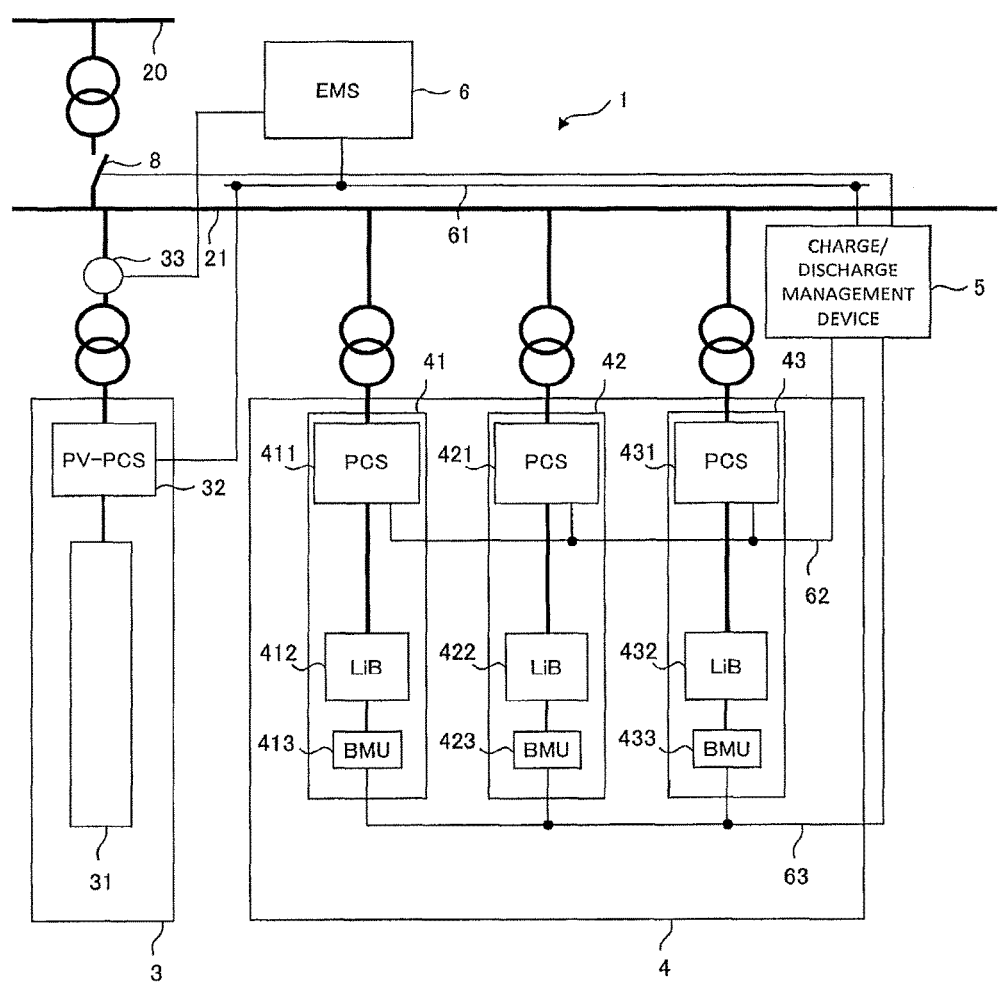
FIG. 4 is a conceptual configuration diagram for describing a system configuration relating to an embodiment 2 of the present invention.

FIG. 4 is a conceptual configuration diagram for describing the system configuration relating to the embodiment 2 of the present invention. Since the configuration illustrated in FIG. 4 is similar to the configuration illustrated in FIG. 1 except for a point that a switch 8 is added, the descriptions are omitted for the configuration other than the switch 8.

Between the power transmission facility 20 and the intra-equipment electric wire 21, the switch 8 is provided. The switch 8 is a switch capable of switching an electrical connection of the power system and the intra-equipment electric wire 21 to either one of a connected state and a disconnected state. The switch 8 is connected to the charge/discharge management device 5 by a signal line. The switch 8 is turned to the connected state in response to a connection command from the charge/discharge management device 5, and is turned to the disconnected state in response to a disconnection command from the charge/discharge management device 5.

[Characteristic Control in Embodiment 2]

In the above-described embodiment 1, the charge/discharge command is transmitted to each of the measurement target storage battery and the measurement support storage battery. In contrast, in the embodiment 2, the power system and the intra-plant equipment 1 are electrically cut off beforehand, and the measurement support storage battery is autonomously operated beforehand. Then, the storage battery capacity measurement device 7 is characteristic in a point of realizing the function similar to that of the embodiment 1 by transmitting the charge/discharge command only to the PCS to which the measurement target storage battery is connected.

Figure 5:
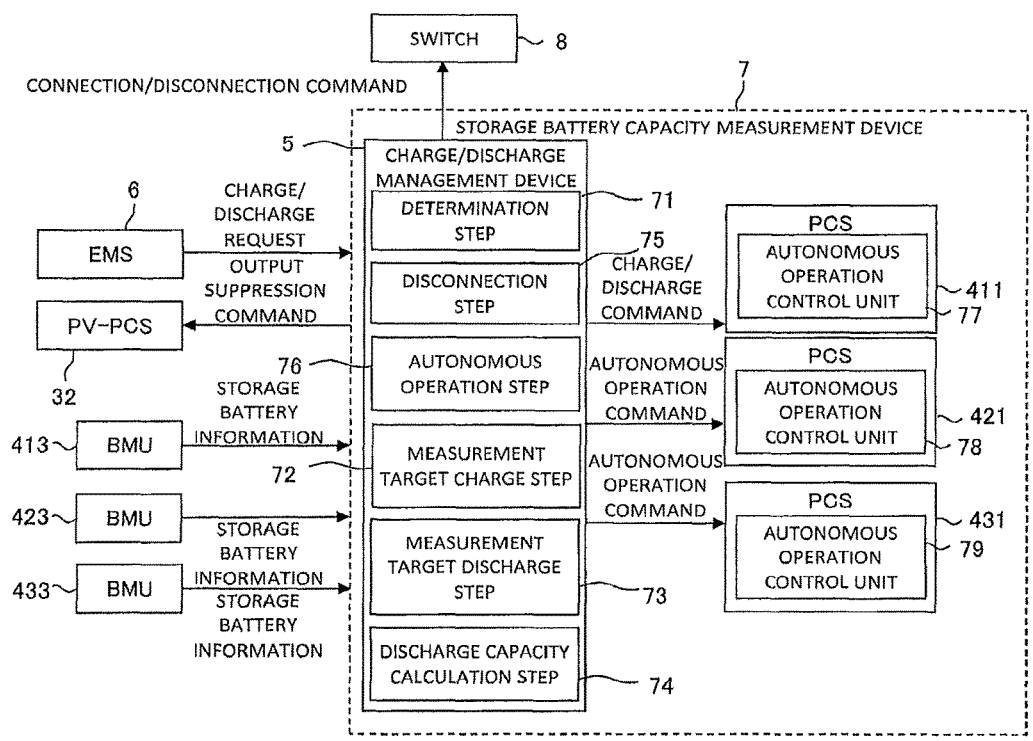
FIG. 5 is a block diagram of a system relating to the embodiment 2 of the present invention.

FIG. 5 is a block diagram of the system relating to the embodiment 2 of the present invention. The storage battery capacity measurement device 7 relating to the present invention illustrated in FIG. 5 includes the charge/discharge management device 5, the first PCS 411, the second PCS 421, and the third PCS 431.

Inside a block indicating the charge/discharge management device 5, a part of the various processing that the charge/discharge management device 5 has is expressed by a block. The arithmetic resource is allocated to each of the blocks. Programs corresponding to the respective blocks are prepared in the charge/discharge management device 5, and by executing them by the processor, the processing of each block is realized in the charge/discharge management device 5.

(Determination Step)

The charge/discharge management device 5 is configured to execute the processing of the determination step 71. In the determination step, the charge/discharge management device 5 determines one storage battery among the plurality of storage batteries as the measurement target storage battery. In addition, the charge/discharge management device 5 determines at least one storage battery other than the measurement target storage battery among the plurality of storage batteries as the measurement support storage battery. Here, the measurement support storage battery and the measurement target storage battery are determined such that the discharge capacity on the specifications of the measurement support storage battery is larger than the discharge capacity on the specifications of the measurement target storage battery.

For example, in the case that the discharge capacities on the specifications of the first storage battery 412, the second storage battery 422 and the third storage battery 432 are the same, the charge/discharge management device 5 determines the first storage battery 412 of the first PCS group 41 as the measurement target storage battery, and determines the second storage battery 422 of the second PCS group 42 and the third storage battery 432 of the third PCS group 43 as the measurement support storage batteries. It is similar in an example described below.

Note that the charge/discharge management device 5 determines a different storage battery as the measurement target storage battery every time the processing of the determination step 71 is executed.

(Disconnection Step)

The charge/discharge management device 5 is configured to execute the processing of a disconnection step 75. The disconnection step 75 is executed after the determination step 71 is executed. In the disconnection step 75, the charge/discharge management device 5 outputs a disconnection command to the switch 8. By the switch 8 being turned to the disconnected state, the power system and the intra-equipment electric wire 21 are electrically cut off, and the electric power supply/demand between the power system and the intra-plant equipment 1 is eliminated.

(Autonomous Operation Step)

The charge/discharge management device 5 is configured to execute the processing of an autonomous operation step 76. The autonomous operation step 76 is executed after the disconnection step 75 is executed. In the autonomous operation step 76, the charge/discharge management device 5 transmits an autonomous operation command for operating the PCS connected to the measurement support storage battery in an autonomous operation mode. The autonomous operation mode is a mode of automatically charging and discharging the measurement support storage battery so as to balance the electric power supply/demand of the intra-equipment electric wire 21.

Specifically, the first PCS 411 includes an autonomous operation control unit 77 that makes the first PCS 411 execute the autonomous operation mode in response to the autonomous operation command. By executing the autonomous operation mode, the voltage of the intra-equipment electric wire 21 is controlled to be fixed. In addition, the second PCS 421 includes an autonomous operation control unit 78 having the function similar to the autonomous operation control unit 77. The third PCS 431 includes an autonomous operation control unit 79 having the function similar to the autonomous operation control unit 77.

In the example illustrated in FIG. 5, the charge/discharge management device 5 transmits the autonomous operation command to the second PCS 421 and the third PCS 431.

(Measurement Target Charge Step)

The charge/discharge management device 5 is configured to execute the processing of the measurement target charge step 72. The measurement target charge step 72 is executed after the autonomous operation step 76 is executed. In the measurement target charge step 72, the charge/discharge management device 5 charges the electricity amount of the measurement target storage battery to the upper limit. Simultaneously with it, in the measurement target charge step 72, the PCS during the operation in the autonomous operation mode makes the measurement support storage battery discharge the electricity amount to be charged by the measurement target storage battery.

For example, the charge/discharge management device 5 transmits the charge command to the first PCS 411 until the electricity amount of the first storage battery 412 reaches the upper limit. On the other hand, the second PCS 421 and the third PCS 431 during the operation in the autonomous operation mode make the second storage battery 422 and the third storage battery 432 discharge the electricity amount for which the electricity amount to be charged by the first storage battery 412 is proportionately divided.

Here, the upper limit electricity amount is the electricity amount in the state that the charge is completed, and corresponds to the electricity amount of the so-called full charge state. Whether or not the upper limit is reached can be determined on the basis of the charge time or the decrease state of the charge current, for example. Note that, in the case that the first storage battery 412 is already in the full charge state, the measurement target charge step 72 may not be executed.

(Measurement Target Discharge Step)

The charge/discharge management device 5 is configured to execute the processing of the measurement target discharge step 73. The measurement target discharge step 73 is executed after the measurement target charge step 72 is executed. However, in the case that the electricity amount of the measurement target storage battery has already reached the upper limit, since further charge is not necessary, the measurement target discharge step 73 is executed after the autonomous operation step 76 is executed. In the measurement target discharge step 73, the charge/discharge management device 5 discharges the electricity amount of the measurement target storage battery from the upper limit to a lower limit. Simultaneously with it, the PCS during the operation in the autonomous operation mode charges the electricity amount discharged by the measurement target storage battery to the measurement support storage battery.

For example, the charge/discharge management device 5 transmits the discharge command to the first PCS 411 so as to discharge the first storage battery 412 until the electricity amount of the first storage battery 412 reaches the lower limit. On the other hand, the second PCS 421 and the third PCS 431 during the operation in the autonomous operation mode proportionately divide the electricity amount discharged by the first storage battery 412 and charge it to the second storage battery 422 and the third storage battery 432.

Here, the lower limit electricity amount corresponds to the electricity amount of the so-called empty state. Whether or not the lower limit is reached can be determined by detecting the decline of the voltage to the discharge end voltage.

(Discharge Capacity Calculation Step)

The charge/discharge management device 5 is configured to execute the processing of the discharge capacity calculation step 74. The discharge capacity calculation step 74 is executed in parallel with the measurement target discharge step 73. In the discharge capacity calculation step 74, the charge/discharge management device 5 calculates the discharge capacity of the measurement target storage battery on the basis of the integrated value of the current flowing through the measurement target storage battery during the discharge by the measurement target discharge step 73.

(Flowchart)

Figure 6:
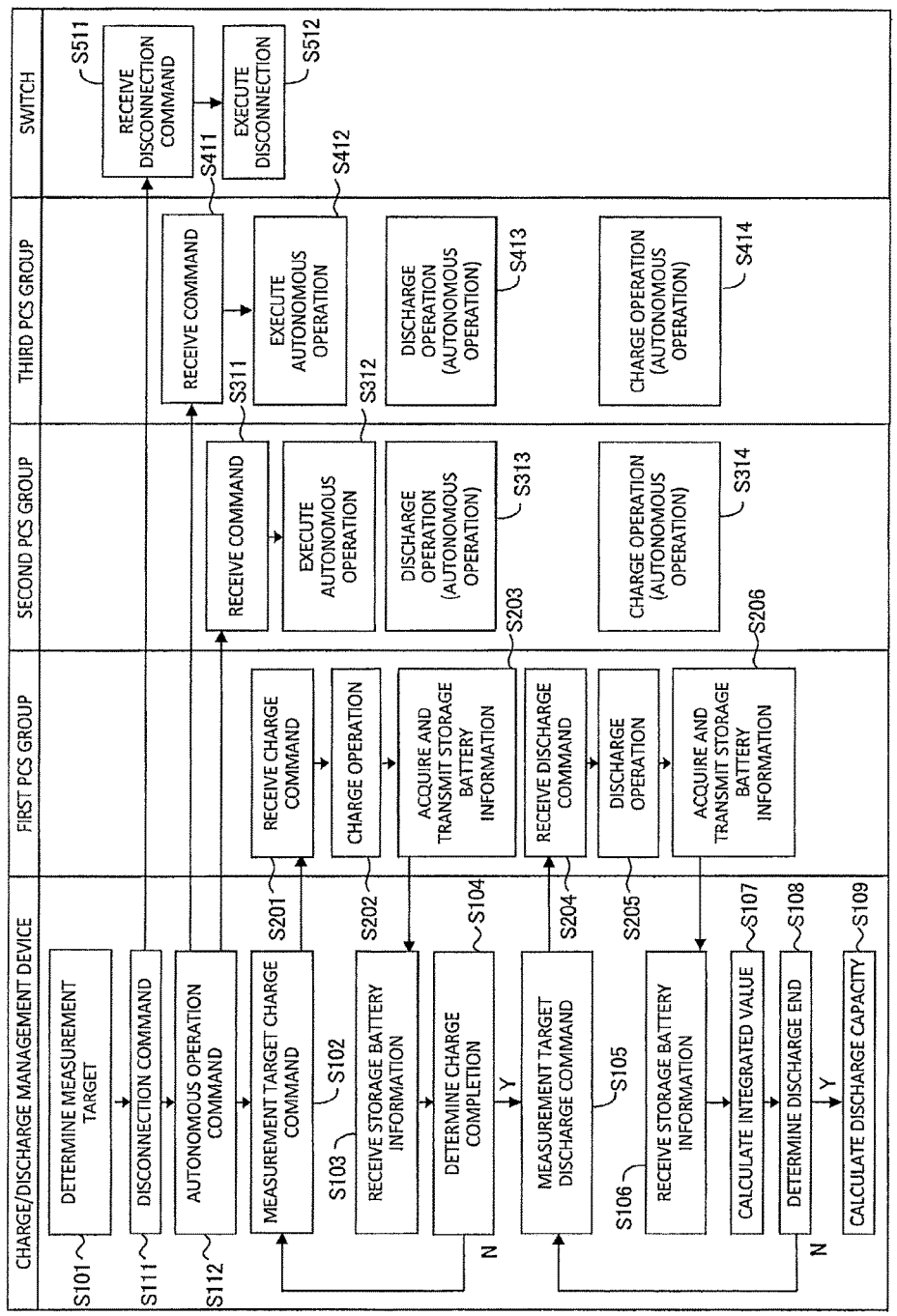
FIG. 6 is a flowchart of a control routine executed by the storage battery capacity measurement device 7, in the system relating to the embodiment 2 of the present invention.

FIG. 6 is a flowchart of a control routine executed by the storage battery capacity measurement device 7, in the system relating to the embodiment 2 of the present invention. The processing of the charge/discharge management device 5 illustrated in the flowchart is realized by executing each processing of the determination step 71, the measurement target charge step 72, the measurement target discharge step 73, the discharge capacity calculation step 74, the disconnection step 75, and the autonomous operation step 76. The program that executes the processing in the flowchart illustrated in FIG. 6 is stored in the memory of the charge/discharge management device 5, and by reading and executing the program by the processor of the charge/discharge management device 5, the processing illustrated in FIG. 6 is realized.

First, the charge/discharge management device 5 determines the measurement target storage battery and the measurement support storage batteries (step S101). The processing content of step S101 is as described in the description of the determination step 71. In the description of FIG. 6, the charge/discharge management device 5 determines the first storage battery 412 of the first PCS group 41 as the measurement target storage battery, and the second storage battery 422 of the second PCS group 42 and the third storage battery 432 of the third PCS group 43 as the measurement support storage batteries.

Next, the charge/discharge management device 5 outputs the disconnection command to the switch 8 (step S111). The processing content of step S111 is as described in the description of the disconnection step 75. The switch 8 receives the disconnection command transmitted from the charge/discharge management device 5 (step S511). The switch 8 turns the switch 8 to the disconnected state according to the disconnection command (step S512).

After the processing of step S111, the charge/discharge management device 5 transmits the autonomous operation command to the PCS connected to the measurement support storage battery (step S112). The processing content of step S/112 is as described in the description of the autonomous operation step 76. In the example illustrated in FIG. 6, the charge/discharge management device 5 transmits the autonomous operation command to the second PCS group 42 and the third PCS group 43.

In the second PCS group 42, the second PCS 421 receives the autonomous operation command transmitted from the charge/discharge management device 5 (step S311) The second PCS 421 makes the second PCS 421 execute the autonomous operation mode according to the autonomous operation command (step S312).

In the third PCS group 43, the third PCS 431 receives the autonomous operation command transmitted from the charge/discharge management device 5 (step S411). The third PCS 431 makes the third PCS 431 execute the autonomous operation mode according to the autonomous operation command (step S412).

After the processing of step 5112, the charge/discharge management device 5 transmits the charge command so as to charge the electricity amount of the measurement target storage battery to the upper limit (step S102). In the example illustrated in FIG. 6, the charge/discharge management device 5 transmits the charge command to the first PCS group 41.

In the first PCS group 41, the first PCS 411 receives the charge command transmitted from the charge/discharge management device 5 (step S201). The first PCS 411 executes the charge operation to the first storage battery 412 according to the charge command (step S202).

In the second PCS group 42, the second PCS 421 during the autonomous operation executes the discharge operation of discharging the second storage battery 422 corresponding to the charge of the first storage battery 412 (step S313).

In the third PCS group 43, the third PCS 431 during the autonomous operation executes the discharge operation of discharging the third storage battery 432 corresponding to the charge of the first storage battery 412 (step S413).

After the processing of step 5202, in the first PCS group 41, the first BMU 413 acquires the storage battery information using the various kinds of sensors. The storage battery information includes the current flowing through the first storage battery 412, the voltage of the first storage battery 412, and the temperature of the first storage battery 412. Thereafter, the first BMU 413 transmits the acquired storage battery information to the charge/discharge management device 5 (step S203).

The charge/discharge management device 5 receives the storage battery information transmitted from the first BMU 413 (step S103).

Next, the charge/discharge management device 5 determines whether or not the charge is completed on the basis of each storage battery information received in step S103 (step S104). For example, in the case that the charge time set beforehand elapses or in the case that the charge current becomes lower than the setting value set beforehand, it is determined that the charge of the first storage battery 412 is completed. In the case that the determination condition is not established, the processing is continued again from step S102.

In the case that the determination condition in step S104 is established, next, the charge/discharge management device 5 transmits the discharge command to discharge the electricity amount of the measurement target storage battery from the upper limit to the lower limit (step S105). In the example illustrated in FIG. 6, the charge/discharge management device 5 transmits the discharge command to the first PCS group 41.

In the first PCS group 41, the first PCS 411 receives the discharge command transmitted from the charge/discharge management device 5 (step S204). The first PCS 411 executes the discharge operation to the first storage battery 412 according to the discharge command (step S205).

In the second PCS group 42, the second PCS 421 during the autonomous operation executes the charge operation of charging the second storage battery 422 corresponding to the discharge of the first storage battery 412 (step S314).

In the third PCS group 43, the third PCS 431 during the autonomous operation executes the charge operation of charging the third storage battery 432 corresponding to the discharge of the first storage battery 412 (step S414).

After the processing of step S205, in the first PCS group 41, the first BMU 413 acquires the storage battery information using the various kinds of sensors. Thereafter, the first BMU 413 transmits the acquired storage battery information to the charge/discharge management device 5 (step S206).

The charge/discharge management device 5 receives the storage battery information transmitted from the first BMU 413 (step S106)

Next, the charge/discharge management device 5 calculates the integrated value of the current flowing through the first storage battery 412, on the basis of the storage battery information (step S107).

Next, the charge/discharge management device 5 determines whether or not the discharge is ended, on the basis of the storage battery information received in step S103 (step S108). For example, in the case that the voltage declines to the discharge end voltage set beforehand, it is determined that the discharge of the first storage battery 412 is ended. In the case that the determination condition is not established, the processing is executed again from step S105.

In the case that the determination condition in step S108 is established, the charge/discharge management device 5 calculates the discharge capacity (Ah) based on the integrated value of the current calculated in step S107 (step S109).

As described above, in the storage battery capacity measurement device 7 of the present embodiment, the power system and the intra-plant equipment 1 are electrically cut off beforehand, and the measurement support storage battery is autonomously operated beforehand. Therefore, the storage battery capacity measurement device 7 can realize the function similar to that of the embodiment 1 by transmitting the charge/discharge command only to the PCS to which the measurement target storage battery is connected.

Now, in the system of the embodiment 1 described above, the lithium-ion battery is used as the storage battery, and it is not limited thereto. As a kind of the storage battery, the storage battery may be a sodium-sulfur battery or a nickel-hydrogen battery or the like.

REFERENCE SIGNS LIST

1 In-plant equipment
3 Power generation system
4 Storage battery system
5 Charge/discharge management device
6 Energy management system (EMS)
7 Storage battery capacity measurement device
8 Switch
20 Power transmission facility
21 Intra-equipment electric wire
31 Photovoltaic power generation module
32 PV-PCS
33 Power meter
41 First PCS group
42 Second PCS group
43 Third PCS group
61, 62, 63 Computer network
71 Determination step
72 Measurement target charge step
73 Measurement target discharge step
74 Discharge capacity calculation step
75 Disconnection step
76 Autonomous operation step
77, 78, 79 Autonomous operation control unit
411 First PCS
412 First storage battery
413 First BMU
421 Second PCS
422 Second storage battery
423 Second BMU
431 Third PCS
432 Third storage battery
433 Third BMU

The invention claimed is:
1. A storage battery capacity measurement device provided in in-plant equipment including a storage battery system connected to an intra-equipment electric wire,
wherein the intra-equipment electric wire is connected to a power system,
wherein the storage battery system includes a plurality of storage batteries connected in parallel to the intra-equipment electric wire,
wherein the in-plant equipment includes a switch capable of switching an electrical connection of the power system and the intra-equipment electric wire to either one of a connected state or a disconnected state, and
wherein each of the plurality of storage batteries is connected to an individual power conditioning system,
the storage battery capacity measurement device comprising:
a processor to execute a program; and
a memory to store the program which, when executed by the processor, results in performance of steps comprising,
a) determining one storage battery among the plurality of storage batteries as a measurement target storage battery, and at least one storage battery other than the measurement target storage battery as a measurement support storage battery,
b) switching to the disconnected state,
c) operating the power conditioning system connected to the measurement support storage battery in an autonomous operation mode, in the disconnected state,
d) discharging an electricity amount of the measurement target storage battery from an upper limit to a lower limit, and charging the discharged electricity amount to the measurement support storage battery, and
e) calculating a discharge capacity of the measurement target storage battery, on a basis of an integrated value of a current flowing through the measurement target storage battery during discharge, and wherein the autonomous operation mode is a mode of automatically charging and discharging the measurement support storage battery so as to balance electric power supply/demand of the intra-equipment electric wire.

2. The storage battery capacity measurement device according to claim 1, wherein the steps further comprise:

charging the electricity amount of the measurement target storage battery to the upper limit by discharging the measurement support storage battery prior to the discharging step d).

* * * * *